United States Patent
Gilton (10) Patent No.: US 6,852,642 B2
(45) Date of Patent: *Feb. 8, 2005

(54) GAS ASSISTED METHOD FOR APPLYING RESIST STRIPPER AND GAS-RESIST STRIPPER COMBINATIONS

(75) Inventor: Terry L. Gilton, Boise, ID (US)

(73) Assignee: Micron Technology, Inc., Boise, ID (US)

(*) Notice: Subject to any disclaimer, the term of this patent is extended or adjusted under 35 U.S.C. 154(b) by 144 days.

This patent is subject to a terminal disclaimer.

(21) Appl. No.: 10/164,431

(22) Filed: Jun. 6, 2002

(65) Prior Publication Data

US 2002/0151185 A1 Oct. 17, 2002

Related U.S. Application Data

(63) Continuation of application No. 09/639,550, filed on Aug. 16, 2000, now Pat. No. 6,440,871.

(51) Int. Cl.[7] .............................................. H01L 21/302
(52) U.S. Cl. ........................ 438/745; 438/710; 134/102
(58) Field of Search .................... 134/61, 102, 155, 134/902; 438/704, 745–747, 948, 710

(56) References Cited

U.S. PATENT DOCUMENTS

| | | |
|---|---|---|
| 3,734,802 A | 5/1973 | Cohen |
| 5,464,480 A | 11/1995 | Matthews |
| 5,727,578 A | 3/1998 | Matthews |
| 5,776,296 A | 7/1998 | Matthews |
| 5,904,156 A | 5/1999 | Advocate et al. |
| 5,911,837 A | 6/1999 | Matthews |
| 5,971,368 A | 10/1999 | Nelson et al. |
| 6,080,531 A | 6/2000 | Carter et al. |
| 6,091,498 A | 7/2000 | Hanson et al. |
| 6,103,680 A | 8/2000 | Honda et al. |
| 6,164,146 A | 12/2000 | Wydeven |
| 6,267,125 B1 | 7/2001 | Bergman et al. |
| 6,273,108 B1 | 8/2001 | Bergman et al. |
| 6,343,609 B1 | 2/2002 | Kim |
| 6,423,235 B1 | 7/2002 | Shimoi et al. |
| 6,444,047 B1 | 9/2002 | Miyazaki |
| 6,497,768 B2 | 12/2002 | Bergman |
| 6,517,998 B1 | 2/2003 | Noda et al. |
| 6,537,876 B2 | 3/2003 | Chung et al. |
| 6,559,064 B1 | 5/2003 | Shimizu |
| 6,582,525 B2 | 6/2003 | Bergman |
| 6,591,845 B1 | 7/2003 | Bergman et al. |
| 6,593,161 B2 | 7/2003 | Nishiki |
| 6,601,594 B2 | 8/2003 | Bergman |
| 6,634,368 B1 * | 10/2003 | Jung et al. .................. 134/1.3 |

* cited by examiner

Primary Examiner—Matthew Smith
Assistant Examiner—Calvin Lee
(74) Attorney, Agent, or Firm—TraskBritt (57) ABSTRACT

A method for moving resist stripper across the surface of a semiconductor substrate includes applying a wet chemical resist stripper, such as an organic or oxidizing wet chemical resist stripper, to at least a portion of a photomask positioned over the semiconductor substrate. A carrier fluid, such as a gas, is then directed toward the semiconductor substrate so as to move the resist stripper across the substrate. The carrier fluid may be directed toward the substrate as the resist stripper is being applied thereto or following application of the resist stripper. A system for effecting the method is also disclosed.

82 Claims, 4 Drawing Sheets

GAS ASSISTED METHOD FOR APPLYING RESIST STRIPPER AND GAS-RESIST STRIPPER COMBINATIONS

CROSS-REFERENCE TO RELATED APPLICATION

This application is a continuation of application Ser. No. 09/639,550, filed Aug. 16, 2000, now U.S. Pat. No. 6,440,871, issued Aug. 27, 2002.

BACKGROUND OF THE INVENTION

1. Field of the Invention

The present invention relates generally to methods for stripping photoresist from a semiconductor device structure and, in particular, to methods for continuously moving resist stripper across the surface of a semiconductor device structure. More particularly, the present invention relates to resist stripper application methods that include exposing the resist stripper to a gas, to move the resist stripper across the semiconductor device structure, to thin the resist stripper, or to otherwise increase the rate at which the resist stripper removes photoresist from the semiconductor device structure.

2. Background of Related Art

In fabricating semiconductor devices, several material layers, including electrically conductive and insulative layers, are formed and patterned to build various structures upon an active surface of a semiconductor substrate, such as a wafer or other large-scale substrate formed from semiconductive material (e.g., silicon, gallium arsenide, or indium phosphide), thereby forming a semiconductor device structure.

The material layers formed over a semiconductor substrate are typically patterned by forming masks thereover. Photomasks are often employed. The formation of photomasks involves the use of a photoresist material that takes on a specific pattern as the photoresist material is exposed to radiation, such as one or more visible wavelengths of light, through a reticle. In this manner, the reticle and the radiation transmitted therethrough together define the specific pattern of the photoresist. The photoresist is then developed, or cured, so as to maintain the pattern and to form a photomask, which is commonly referred to in the art as a "photoresist" or simply as a "resist." Once the photomask has been formed, one or more underlying material layers may be patterned through the photomask, such as by way of wet or dry etching processes.

After one or more layers underlying a photomask have been patterned through the photomask to form a semiconductor device structure, the photomask is typically removed. Various processes are known for removing photomasks. Typically, a thin layer of a resist stripper is applied to the semiconductor device structure, such as by spraying the resist stripper onto the semiconductor device structure. Alternatively, a semiconductor device structure bearing a photomask is immersed, or dipped, into a bath of wet chemical resist stripper.

One type of resist stripper that may be used to remove a photomask from a semiconductor device structure is a wet chemical resist stripper, such as an organic resist stripper (e.g., phenol-based and phenol-free organic strippers) or an oxidizing resist stripper (e.g., solutions of sulfuric acid ($H_2SO_4$) and an oxidant, such as hydrogen peroxide ($H_2O_2$) or ammonium persulfate). Wet chemical resist strippers typically remove, or dissolve, the photomask with selectivity over (i.e., at a faster rate than) the material of the structures and material layers that underlie and that may be exposed through the photomask or upon removal of the photomask material from the semiconductor device structure. Some such wet chemical resist strippers include one or more types of active chemicals that remove photomasks by reacting with the material or materials of the photomasks. Thus, the concentrations of active chemicals in these wet chemical resist strippers decrease over time, thereby reducing the effectiveness of these resist strippers. Moreover, as the concentrations of reaction products increase in locations where further stripping is desired, the rate at which further reactions between the resist stripper and the photoresist may occur and, thus, the rate at which the photoresist is removed from the semiconductor device structure, are reduced.

As another example, ozonated water may be used as a resist stripper to remove a photomask from a semiconductor substrate. Typically, the water is heated to enhance the ability of the ozone dissolved therein to remove a resist layer from a semiconductor substrate. The heated, ozonated water may be applied to the resist-covered substrate by spraying. As those of skill in the art are aware, ozone effervesces from water relatively quickly. Thus, ozonated water resist strippers lose their effectiveness over time. In addition, as with other types of resist strippers, the rates at which ozonated water resist strippers remove photoresists may be reduced as the concentrations of reaction products increase in the resist stripper.

Conventional processes for applying resist strippers to resist, such as spraying or immersion, do not facilitate continuous movement of the resist strippers across the semiconductor device structure following application and may, therefore, permit the resist strippers to sit, or stagnate, on the resist. Stagnation of resist strippers is somewhat undesirable, however, as the concentrations of reaction products may increase during stagnation and stagnation may, therefore, reduce the rate at which the resist strippers remove photomasks from semiconductor device structures. In addition, when a wet etchant is employed as the resist stripper, the active chemical reactant or reactants of the resist stripper may react with the photomask and, therefore, decrease in concentration. As a result, in a stagnant area, the rate at which such a wet etchant resist stripper removes the photomask and, thus, the ability of such a wet etchant resist stripper to remove the photomask, decreases over time.

In the ozonated water example of a resist stripper, when the resist stripper is at rest, ozone escapes from the water into the atmosphere over time. As the concentration of ozone in the ozonated water resist stripper decreases, the effectiveness of the resist stripper, as well as the rate at which a photomask is removed from a semiconductor substrate therewith, are reduced.

When conventional stripping methods are employed, ozonated water resist strippers typically remove hard-baked photoresist at a rate of about 4,000 Å per minute to less than about 8,000 Å per minute.

The art lacks teaching of methods for introducing one or more gases into or onto a resist stripper to maintain a desired rate for stripping resist from a semiconductor device structure, as well as stripping systems for effecting such methods.

BRIEF SUMMARY OF THE INVENTION

The present invention includes a method and system for stripping resists from semiconductor substrates while maintaining a desired rate of resist stripping. The method of the present invention includes applying a quantity of resist stripper onto a semiconductor device structure and directing at least one carrier fluid, such as a gas other than ozone, toward the resist stripper or forming at least one gas other than ozone in the resist stripper.

The resist stripper is applied to the semiconductor device structure in a manner that the resist stripper contacts at least a portion of a photomask, or resist, to be removed. For example, the resist stripper may be hot ozonated water that includes a concentration sufficient to remove the resist at a desired rate. Other types of resist strippers, such as wet chemical resist strippers, may also be used in accordance with teachings of the present invention. The resist stripper may be applied to at least a portion of the semiconductor device structure by spraying, in a stream, by dipping the semiconductor device structure in the resist stripper, or otherwise, as known in the art.

The resist stripper may be exposed to one or more gases or other carrier fluids prior to, during, or after application thereof onto a photoresist on the semiconductor device structure. The one or more other, non-ozone gases may thin the layer of resist stripper over the semiconductor device structure or move the resist stripper across a surface of the semiconductor device structure, both of which prevent the formation of or eliminate macroscopic drops of resist stripper on the semiconductor device structure. Alternatively, the one or more gases may be the product of one or more chemical reactions effected by or in the resist stripper, in which case the one or more gases are formed in the resist stripper. In any event, by exposing the resist stripper to one or more gases or other carrier fluids, the rate at which the resist stripper removes photoresist from the semiconductor device structure is increased.

As an example of the manner in which resist stripper may be moved across the surface of the semiconductor device structure, one or more gases under pressure, such as in a jet or stream of liquid or gas, may be directed at least partially across the surface of the semiconductor device structure so as to force resist stripper across the semiconductor device structure. This movement of resist stripper across the surface of the substrate prevents stagnation of the resist stripper and, consequently, prevents a reduction in the rate at which the resist stripper removes the photomask from the semiconductor substrate.

The one or more gases may be directed across the surface of the semiconductor device structure substantially simultaneously with the resist stripper, either by combining the gas or gases with the resist stripper or separately from the resist stripper. Alternatively, the gas or gases may be directed across the semiconductor device structure after the resist stripper has been applied to the semiconductor device structure. When the one or more gases are directed across the surface of the semiconductor device structure, the one or more gases force the resist stripper to move across the device structure.

The one or more gases may be directed across the surface of the semiconductor device structure from a central region thereof toward an outer periphery thereof. Alternatively, the one or more gases may be directed onto a surface of a semiconductor device structure near a peripheral edge thereof so as to move resist stripper across the semiconductor device structure. Application of one or more gases may also be effected in any alternative manner that facilitates the substantially continuous movement of resist stripper across the surface of the semiconductor device structure.

The one or more gases will preferably not react with (e.g., oxidize or otherwise react with or change the nature of) materials of structures or layers of the semiconductor device structure that are exposed through the photoresist or as the photoresist is removed from the semiconductor device structure. Gases that may be used in the method of the present invention include, without limitation, inert gases or gas mixtures, such as nitrogen or noble gases (e.g., argon), air, and gaseous hydrochloric acid.

The present invention also includes systems for applying resist stripper to semiconductor device structures in a manner that effects the inventive method. An example of such a system includes a source of resist stripper, a stripper application component for introducing resist stripper onto a surface of a semiconductor device structure, a gas source, and a gas application component for directing gas at least partially across the surface of the semiconductor device structure so as to move resist stripper across the surface. The stripper application and gas application components may be separate from one another or comprise the same component.

Other features and advantages of the present invention will become apparent to those of skill in the art through consideration of the ensuing description, the accompanying drawings, and the appended claims.

DETAILED DESCRIPTION OF THE INVENTION

Figure 1A:
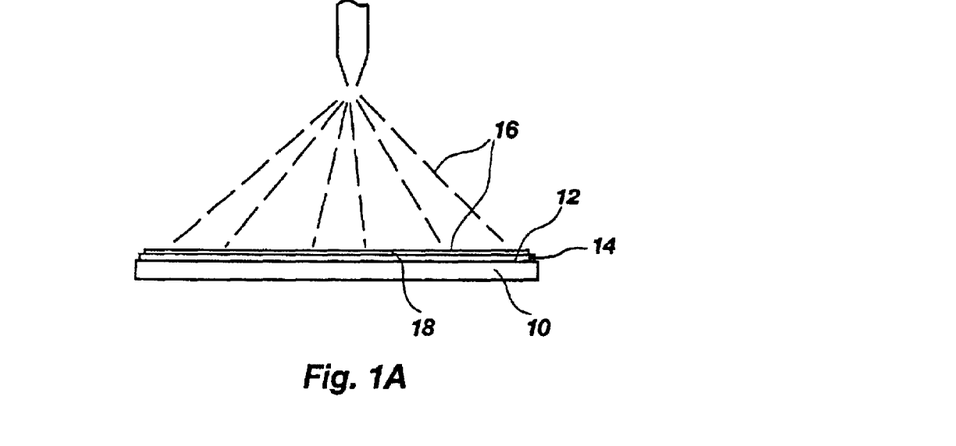
FIG. 1A is a schematic representation of a semiconductor device structure including a photomask with resist stripper applied thereto.
Figure 1B:
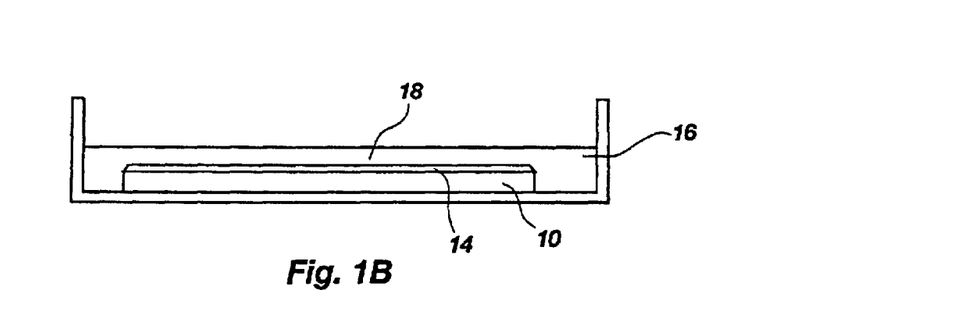
FIG. 1B is a schematic representation illustrating another method of applying photoresist to a photomask on a semiconductor device structure.

FIG. 1A schematically illustrates a semiconductor device structure 10, in this case a semiconductor wafer, including a photomask 14 over an active surface 12 thereof. Photomask 14 is formed from polymerized, or consolidated, photoresist and may be either soft-baked or hard-baked, as known in the art. Resist stripper 16 preferably includes ozone (e.g., ozonated water), but may be any other type of resist stripper known and used in the art. Resist stripper 16 may be applied to photomask 14 by known processes, such as by spraying resist stripper 16 onto photomask 14, as shown in FIG. 1A. As an alternative, resist stripper 16 may be applied to photomask 14 by at least partially immersing photomask 14 in a quantity of resist stripper 16, as illustrated in FIG. 1B. In any event, resist stripper 16 forms a layer 18 over semiconductor device structure 10 and over any photomask 14 on active surface 12 of semiconductor device structure 10.

Figure 2A:
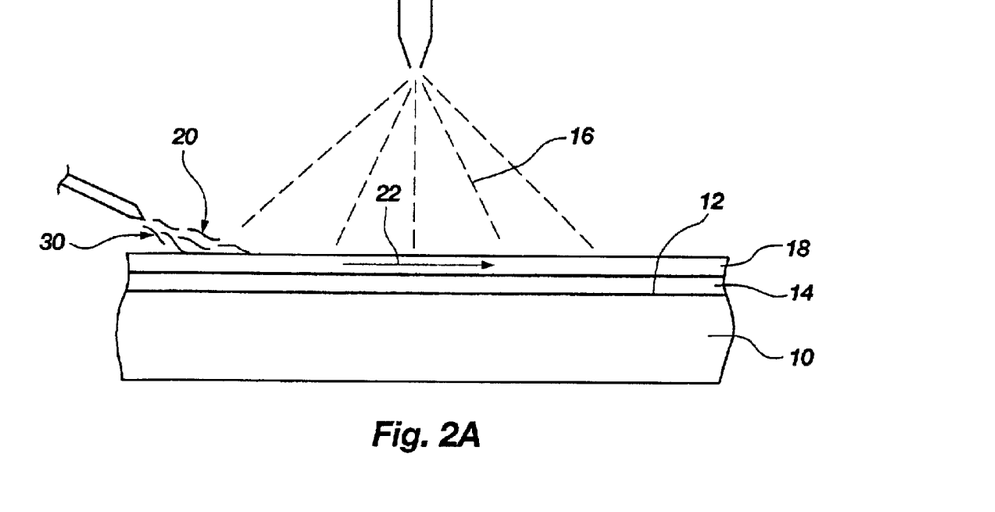
FIGS. 2A and 2B are schematic representations illustrating movement of resist stripper across the surface of the semiconductor device structure by a gas under pressure.
Figure 2B:
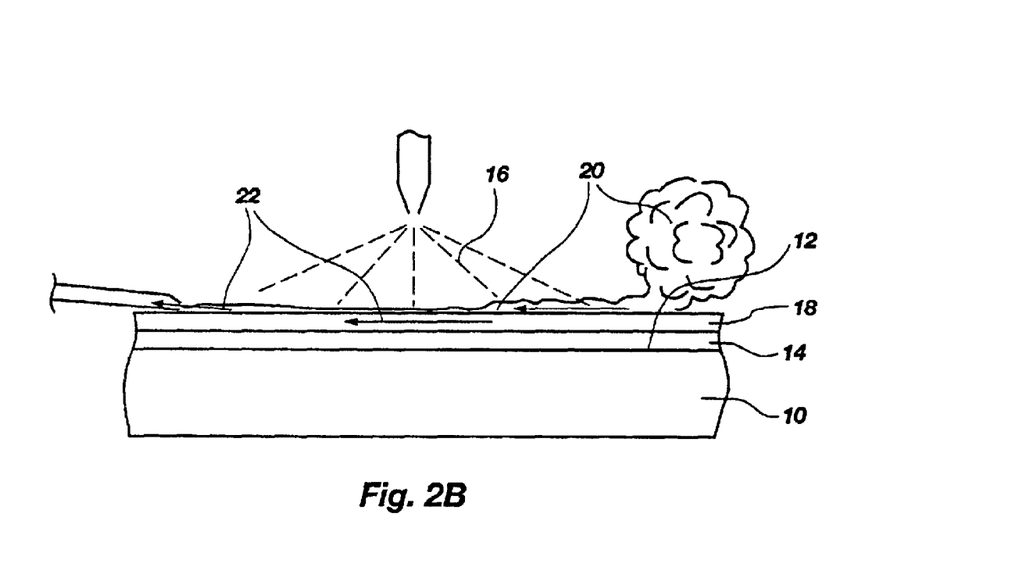

In order to effect the method of the present invention, resist stripper 16 is exposed to one or more gases 20 or other, nongaseous carrier fluids, which effect movement of resist stripper 16 across semiconductor device structure 10 or thin layer 18 of resist stripper 16, as shown in FIGS. 2A and 2B. Both of these effects of exposing resist stripper 16 to gas 20 facilitate the transfer of reaction products of the reaction between resist stripper 16 and the photoresist of photomask 14 away from the location where such a reaction is occurring. For example, as resist stripper 16 is moved laterally across semiconductor device structure 10, fresh resist stripper 16 that includes little or no reaction products is continuously supplied to locations where resist stripper reacts with the photoresist of photomask 14. As another example, by thinning layer 18 of resist stripper 16, reaction products of the reaction between resist stripper 16 and the photoresist of photomask 14 may more readily escape through layer 18 than if layer 18 were thicker, thus permitting the action between resist stripper 16 and the photoresist of photomask 14 to occur at a faster rate than would be possible if higher concentrations of these reaction products were present at the locations where this reaction is occurring. Other methods of exposing resist stripper 16 to gas 20 in a manner that may increase the rate at which resist stripper 16 removes photoresist of photomask 14 from semiconductor device structure 10 are also within the scope of the present invention.

Turning again to FIGS. 2A and 2B, as an example of a way in which resist stripper 16 may be exposed to one or more gases 20, a quantity of gas 20, such as nitrogen, air, or gaseous hydrochloric acid, or another, nongaseous carrier fluid, is directed under pressure (either positive (FIG. 2A) or negative (FIG. 2B)) at least partially across layer 18. Gas 20 does not include ozone. By directing gas 20 at least partially across layer 18, resist stripper 16 of layer 18 is moved across semiconductor device structure 10 in a plane substantially parallel to the plane of semiconductor device structure 10, such as in the directions of arrows 22. In this manner, products of the chemical reaction between the ozone of resist stripper 16 and the material or materials of photomask 14 are continuously moved away from photomask 14, thereby facilitating subsequent reactions between the ozone of resist stripper 16 and the photoresist of photomask 14, as well as the removal of photoresist from semiconductor device structure 10, to proceed at a faster rate. In addition, by directing one or more gases 20 at least partially across layer 18, the thickness of layer 18 may be reduced, which permits reactants of the reaction between the ozone of resist stripper 16 and the photoresist of photomask 14 to more readily pass through layer 18 and disperse.

Figure 3:
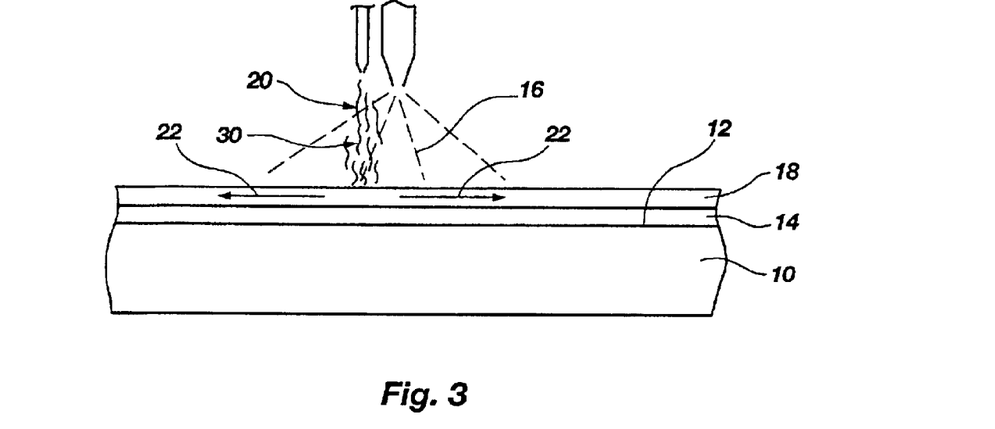
FIG. 3 is a schematic representation of a variation of the use of a gas under pressure to move resist stripper across a semiconductor device structure when the method of the present invention is used.

As shown in FIGS. 2A and 3, gas 20 may be directed toward layer 18 in a pressurized jet 30. Pressurized jet 30 may be directed toward layer 18 from substantially the same location as that from which resist stripper 16 is introduced over semiconductor device structure 10, as shown in FIG. 3, or from a different location than that from which resist stripper 16 is directed over semiconductor device structure 10, as depicted in FIG. 2A.

Figure 4:
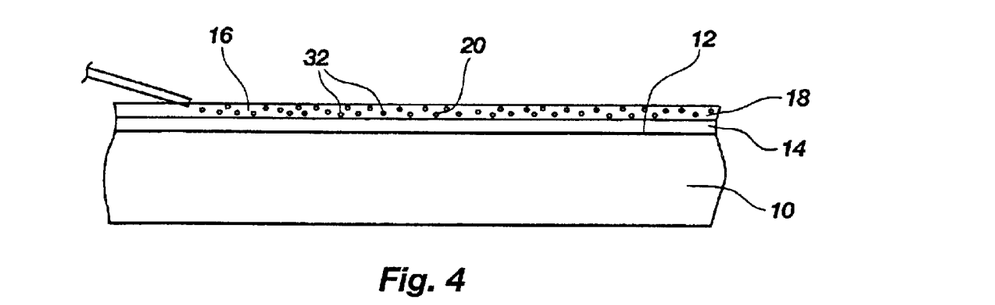
FIG. 4 is a schematic representation of the use of gas bubbles in the resist stripper to effect movement of the resist stripper across a semiconductor wafer in accordance with teachings of the present invention.

With reference to FIG. 4, gas 20 may alternatively be directed across layer 18 of resist stripper 16 in the form of bubbles 32 on the surface of or residing within layer 18. The movement of bubbles 32 across layer 18 may effect the substantially continuous movement of resist stripper 16 over semiconductor device structure 10. As bubbles 32 move through layer 18, products of the reaction between resist stripper 16 and the photoresist of photomask 14 may be carried by bubbles 32 away from the locations in which photoresist removal reactions are occurring. In addition, bubbles 32 may move layer 18 across semiconductor device structure 10 as bubbles 32 flow therethrough. Both of these effects of bubbles 32 facilitate the passage of products of the reaction between resist stripper 16 and the photoresist of photomask 14 away from the locations in which this reaction is occurring, thereby increasing the overall reaction rate.

Figure 5:
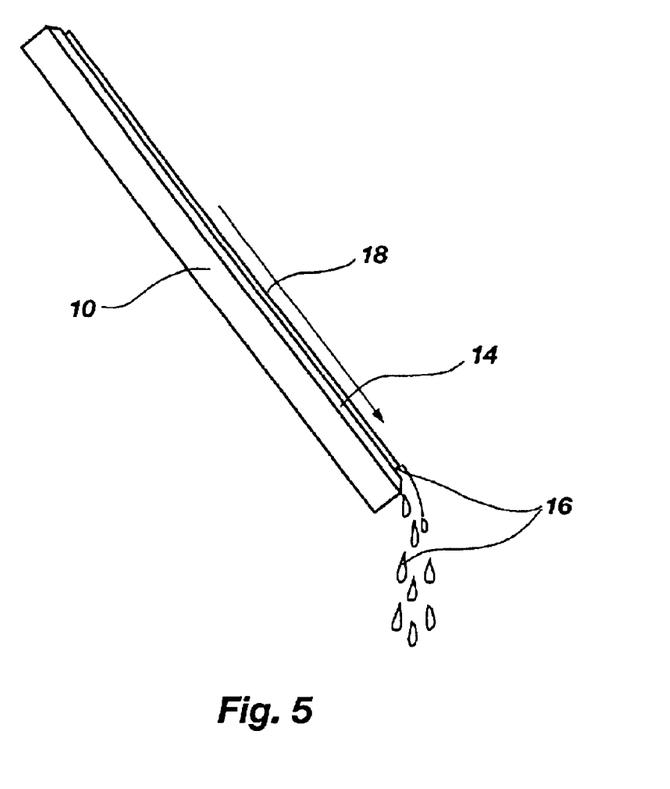
FIG. 5 is a schematic representation illustrating the alternative, nonhorizontal orientation of a semiconductor device structure as a method according to the present invention is being effected.

FIG. 5 depicts the nonhorizontal orientation of a semiconductor device structure 10. When semiconductor device structure 10 is nonhorizontally oriented, gravity further facilitates thinning of layer 18 and movement of resist stripper 16 in layer 18 over semiconductor device structure 10.

Preferably, semiconductor device structure 10 remains substantially stationary as the method of the present invention is being effected. Thus, existing automated wet bench equipment may be used to conduct the method of the present invention.

Figure 6:
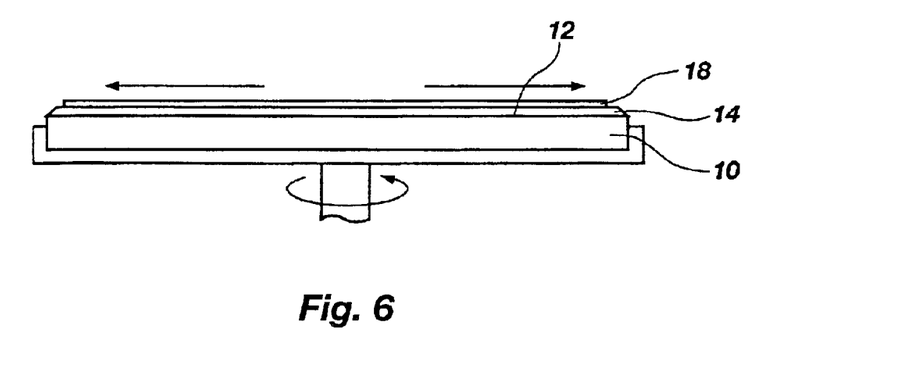
FIG. 6 schematically illustrates rotation of a semiconductor device structure as a method according to the present invention is being effected.

As another alternative, which is illustrated in FIG. 6, a semiconductor device structure 10 may be rotated in a plane thereof to further effect thinning of layer 18 and movement of resist stripper 16 in layer 18 over semiconductor device structure 10 by centrifugal force. Again, the additional thinning and movement of layer 18 provided by such rotation further accelerate the rate at which resist stripper 16 removes the material or materials of photomask 14 from semiconductor device structure 10.

Gas 20 to which layer 18 is exposed may itself increase the rate with which resist stripper 16 removes the material or materials of photomask 14 from semiconductor device structure 10 or otherwise enhances the removal of photomask 14 by resist stripper 16. Chemicals or chemical mixtures that form gas bubbles in layer 18 may also increase the rate at which the resist stripper 16 of layer 18 removes the photoresist of photomask 14 by action of the bubbles, as discussed previously herein with reference to FIG. 4, or by causing the formation of gaseous products as resist stripper 16 reacts with the photoresist, which products form and are carried away in bubbles. For example, hydrochloric acid decreases the pH of resist stripper 16 and increases the concentration of ozone in resist stripper 16, while decreasing the concentration in resist stripper 16 of carbonic acid ($H_2CO_3$), which is a product of the reaction between an ozonated resist stripper 16 and a photoresist. In addition, by adding hydrochloric acid to resist stripper 16, the concentration of hydrogen ions in resist stripper 16 increases, which forces the carbonic acid in resist stripper 16 to be broken up into carbon dioxide ($CO_2$) gas and water ($H_2O$) rather than into carbonate ions ($CO_3^-$) and hydrogen ions ($H^+$). As a result, more carbon dioxide, which is a gas, is formed. Carbon dioxide readily diffuses, effervesces, or bubbles out of resist stripper 16, away from the reaction between resist stripper 16 and the photoresist of photomask 14, and will, therefore, not increase in concentration in the presence of the reaction or decrease the rate at which this reaction occurs. Correspondingly, the formation of carbonic acid, which is an ion that tends to remain dissolved in resist stripper 16, is reduced. Thus, carbonic acid concentrations will not increase as rapidly as if the hydrogen ions from hydrochloric acid were not present and, as a result, the rate at which resist stripper 16 reacts with the photoresist of photomask 14 is not significantly decreased. As directing hydrochloric acid toward layer 18 of resist stripper 16 increases the formation of carbon dioxide gas in resist stripper 16, the direction of one or more gases 20 toward layer 18 may be effected by introducing either gaseous or liquid hydrochloric acid into layer 18. In addition, when hydrochloric acid is used, the rate at which resist stripper 16 removes the material or materials of photomask 14 may be increased without actually moving layer 18 or thinning layer 18.

Figure 7A:
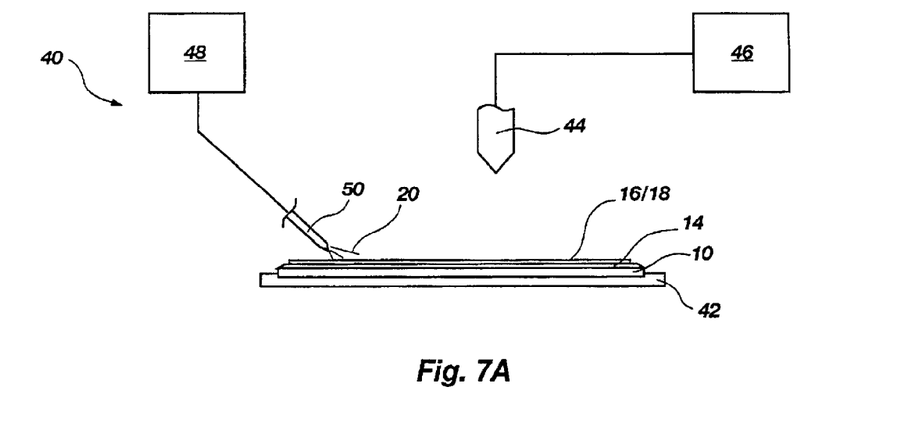
FIGS. 7A and 7B schematically depict systems for effecting methods that incorporate teachings of the present invention.

FIG. 7A illustrates an exemplary resist stripping system 40 for effecting the stripping method of the present invention. Resist stripping system 40 includes a wafer support 42, upon which a semiconductor device structure 10 having photoresist thereon is positioned. Wafer support 42 may be configured to orient a semiconductor device structure 10 positioned thereon nonhorizontally. Wafer support 42 may also be configured to rotate a semiconductor device structure 10 positioned thereon. A stripper applicator 44 of resist stripping system 40 obtains resist stripper 16 from a source 46 and applies resist stripper 16 to a photomask 14 on a semiconductor device structure 10 disposed on wafer support 42. Resist stripping system 40 also includes a gas source 48, from which gas 20 is supplied and which communicates with a gas output element 50 that directs gas 20 toward wafer support 42 so as to effect the direction of gas 20 at least partially toward resist stripper 16 or to otherwise expose resist stripper 16 to gas 20.

Figure 7B:
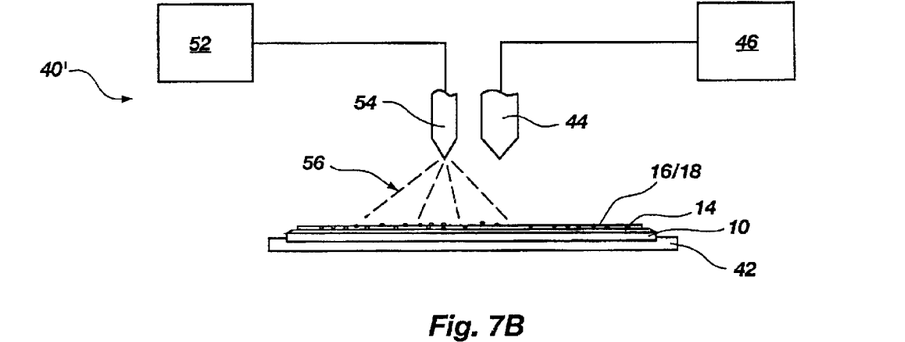

Alternatively, as shown in FIG. 7B, a resist stripping system 40' incorporating teachings of the present invention may include a chemical output element 54 to which directs a chemical 56, such as hydrochloric acid, from a chemical source 52 toward wafer support 42 so as to expose resist stripper 16 on a semiconductor device structure 10 positioned on wafer support 42 to chemical 56 and to induce the formation of gas bubbles 32 (FIG. 4) in resist stripper 16.

When methods incorporating teachings of the present invention are employed, the rates with which these ozonated strippers 16 remove hard-baked photoresists are at least about 8,000 angstroms per minute up to about 12,000 angstroms per minute and greater, as compared with conventional resist stripping methods employing ozonated resist strippers, which remove hard-baked photoresists at much slower rates. While the methods of the present invention are particularly useful for increasing the rates with which ozonated resist strippers 16 remove photoresists, the teachings of the present invention may also be employed to increase the rates with which other types of resist strippers remove photoresists.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method for removing photoresist from a semiconductor device structure, comprising:
   applying a quantity of ozonated water to the photoresist; and
   directing at least one gas other than ozone toward the ozonated water so as to move the ozonated water across the photoresist.

2. The method of claim 1, wherein directing the at least one gas comprises directing the at least one gas toward the semiconductor device structure from a location that is different than a location from which applying is effected.

3. The method of claim 1, wherein directing the at least one gas comprises directing the at least one gas from the same location as that from which applying the ozonated water is effected.

4. The method of claim 1, wherein directing the at least one gas comprises directing a gas comprising at least one of nitrogen, air, and gaseous hydrochloric acid toward the semiconductor device structure.

5. The method of claim 1, further comprising orienting a plane of the semiconductor device structure nonhorizontally.

6. The method of claim 1, further comprising rotating the semiconductor device structure about an axis perpendicular to a plane thereof.

7. The method of claim 1, wherein directing the at least one gas comprises flowing bubbles comprising the at least one gas across the photoresist.

8. The method of claim 1, wherein directing the at least one gas comprises thinning the quantity of ozonated water on the photoresist.

9. The method of claim 1, wherein directing the at least one gas comprises directing at least one gas that will facilitate removal of reactants from over the semiconductor device structure.

10. The method of claim 1, wherein directing the at least one gas comprises directing a gas substantially free of ozone toward the ozonated water.

11. A method for preventing macroscopic drops of a resist stripper comprising ozone from forming over a surface of a semiconductor device structure, comprising directing at least one gas other than ozone at least partially across resist stripper located over the semiconductor device structure.

12. The method of claim 11, wherein directing comprises directing nitrogen at least partially across the resist stripper.

13. The method of claim 11, wherein directing comprises directing at least one gas that facilitates removal of products of a reaction between the resist stripper and a resist on the semiconductor device structure.

14. The method of claim 13, wherein directing the at least one gas comprises directing gaseous hydrochloric acid at least partially across the resist stripper.

15. The method of claim 11, wherein directing comprises substantially continuously moving the resist stripper laterally over the semiconductor device structure.

16. The method of claim 11, wherein directing comprises thinning the resist stripper.

17. The method of claim 11, wherein directing comprises directing a pressurized jet comprising the at least one gas at least partially toward the resist stripper.

18. The method of claim 11, wherein directing comprises flowing bubbles comprising the at least one gas at least partially over a surface of the semiconductor device structure.

19. The method of claim 11, further comprising orienting a plane of the semiconductor device structure nonhorizontally.

20. The method of claim 11, further comprising rotating the semiconductor device structure in a plane thereof.

21. A method for substantially continuously moving resist stripper comprising ozone laterally over a surface of a semiconductor device structure, comprising directing at least one gas other than ozone at least partially toward the resist stripper.

22. The method of claim 21, wherein directing comprises directing nitrogen at least partially toward the resist stripper.

23. The method of claim 21, wherein directing comprises directing at least one gas that will facilitate removal of a resist from the semiconductor device structure at least partially toward the resist stripper.

24. The method of claim 23, wherein directing the at least one gas comprises directing gaseous hydrochloric acid.

25. The method of claim 21, wherein directing at least partially thins a layer of the resist stripper.

26. The method of claim 21, wherein directing comprises directing a pressurized jet of the at least one gas at least partially toward the resist stripper.

27. The method of claim 21, wherein directing comprises flowing bubbles comprising the at least one gas over a surface of a resist on the semiconductor device structure.

28. The method of claim 21, wherein directing effects removal of a hard-baked resist on the semiconductor device structure at a rate of at least about 8,000 angstroms per minute.

29. The method of claim 21, wherein directing effects removal of a hard-baked resist on the semiconductor device structure at a rate of about 8,000 to about 12,000 angstroms per minute.

30. The method of claim 21, further comprising orienting a plane of the semiconductor device structure nonhorizontally.

31. The method of claim 21, further comprising rotating the semiconductor device structure about an axis perpendicular to a plane thereof.

32. A method for supplying a resist stripper comprising ozone over a surface of a semiconductor device structure, comprising:
    applying the resist stripper to the surface of the semiconductor device structure; and
    directing at least one gas other than ozone at least partially toward the resist stripper.

33. The method of claim 32, wherein directing comprises directing nitrogen at least partially toward the resist stripper.

34. The method of claim 32, wherein directing comprises directing at least one gas that facilitates removal of the resist at least partially toward the resist stripper.

35. The method of claim 34, wherein directing the at least one gas comprises directing gaseous hydrochloric acid at least partially toward the resist stripper.

36. The method of claim 32, wherein directing comprises substantially continuously moving the resist stripper laterally over the semiconductor device structure.

37. The method of claim 32, wherein directing is effected from the location from which applying is effected.

38. The method of claim 32, wherein directing is effected from substantially the same location as applying.

39. The method of claim 32, wherein applying comprises spraying a quantity of the resist stripper onto the semiconductor device structure.

40. The method of claim 32, wherein applying comprises immersing at least a portion of a surface of a resist on the surface of the semiconductor device structure in a quantity of the resist stripper.

41. The method of claim 32, wherein directing comprises directing a pressurized jet comprising the at least one gas at least partially toward the resist stripper.

42. The method of claim 32, wherein directing comprises flowing bubbles comprising the at least one gas over a surface of a resist on the surface of the semiconductor device structure.

43. The method of claim 32, wherein applying and directing effect removal of a hard-baked resist at a rate of at least about 8,000 angstroms per minute.

44. The method of claim 32, wherein applying and directing effect removal of a hard-baked resist at a rate of about 8,000 to about 12,000 angstroms per minute.

45. The method of claim 32, further comprising orienting a plane of the semiconductor device structure nonhorizontally.

46. The method of claim 32, further comprising rotating the semiconductor device structure about an axis perpendicular to a plane thereof.

47. A system for removing resist from a semiconductor device structure, comprising:
    a source of resist stripper, the resist stripper comprising ozone;
    an applicator in communication with the source and configured to apply a quantity of the resist stripper to the resist;
    a gas source of at least one gas other than ozone; and
    a gas output element in communication with the gas source and configured to direct the at least one gas at least partially toward the resist.

48. The system of claim 47, wherein the at least one gas comprises nitrogen.

49. The system of claim 47, wherein the at least one gas includes at least one gas that facilitates removal of the resist from the semiconductor device structure.

50. The system of claim 49, wherein the at least one gas comprises gaseous hydrochloric acid.

51. The system of claim 47, wherein the applicator is configured to at least partially coat the resist with the resist stripper.

52. The system of claim 51, wherein the applicator is configured to spray the quantity of the resist stripper onto at least a portion of the resist.

53. The system of claim 47, wherein the applicator comprises the quantity of the resist stripper within which at least a portion of a surface of the resist is immersible.

54. The system of claim 47, wherein the gas output element is positioned and configured to effect movement of the resist stripper laterally over a surface of the semiconductor device structure.

55. The system of claim 47, wherein the gas output element is located and configured to thin a layer of the resist disposed over a surface of the semiconductor device structure.

56. The system of claim 47, wherein the gas output element is configured and located so as to direct the at least one gas in substantially the same direction as the direction in which the applicator is located and configured to apply the resist stripper.

57. The system of claim 47, wherein the gas output element is configured to direct the at least one gas in a different direction from the direction in which the applicator is located and configured to apply the resist stripper.

58. The system of claim 47, further comprising a support structure configured to orient a plane of the semiconductor device structure nonhorizontally.

59. The system of claim 47, further comprising a support structure configured to rotate the semiconductor device structure about an axis perpendicular to a plane thereof.

60. In combination, a resist stripper comprising ozone and at least one gas other than ozone under pressure so as to cause movement of reaction products away from a resist stripper.

61. The combination of claim 60, wherein the at least one gas effects movement of the resist stripper.

62. The combination of claim 60, wherein the at least one gas thins the resist stripper.

63. The combination of claim 60, wherein the resist stripper and the at least one gas are together formulated to remove a hard-baked resist at a rate of at least about 8,000 angstroms per minute.

64. The combination of claim 60, wherein the resist stripper and the at least one gas are together formulated to remove a hard-baked resist at a rate of about 8,000 to about 12,000 angstroms per minute.

65. The combination of claim 60, wherein the at least one gas comprises nitrogen.

66. The combination of claim 60, wherein the at least one gas comprises at least one gas that facilitates dissolution of a resist.

67. The combination of claim 66, wherein the at least one gas comprises gaseous hydrochloric acid.

68. A method for facilitating the removal of reactants from a resist stripper during removal thereof from a semiconductor device structure, comprising:

applying a resist stripper comprising ozone to a resist on the semiconductor device structure; and directing a quantity of at least one gas other than ozone at least partially toward the resist stripper.

69. The method of claim 68, wherein applying comprises at least partially coating the resist with the resist stripper.

70. The method of claim 68, wherein applying comprises spraying the resist stripper onto the resist.

71. The method of claim 68, wherein applying comprises immersing at least a portion of a surface of the resist within a quantity of the resist stripper.

72. The method of claim 68, wherein directing is effected from substantially the same location as the location from which applying is effected.

73. The method of claim 68, wherein directing is effected from a different location than the location from which applying is effected.

74. The method of claim 68, wherein directing comprises directing nitrogen at least partially toward the resist stripper.

75. The method of claim 68, wherein directing comprises directing at least one gas that facilitates removal of the resist at least partially toward the resist stripper.

76. The method of claim 75, comprising directing hydrochloric acid at least partially toward the resist stripper.

77. The method of claim 68, wherein directing the at least one gas comprises effecting movement of the resist stripper laterally over the semiconductor device structure.

78. The method of claim 68, wherein directing the at least one gas comprises thinning the resist stripper.

79. The method of claim 68, wherein applying and directing remove a hard-baked resist at a rate of at least about 8,000 angstroms per minute.

80. The method of claim 68, wherein applying and directing remove a hard-baked resist at a rate of about 8,000 to about 12,000 angstroms per minute.

81. The method of claim 68, further comprising orienting a plane of the semiconductor device structure nonhorizontally.

82. The method of claim 68, further comprising rotating the semiconductor device structure about an axis perpendicular to a plane thereof.

* * * * *

UNITED STATES PATENT AND TRADEMARK OFFICE
CERTIFICATE OF CORRECTION

PATENT NO. : 6,852,642 B2  Page 1 of 1
APPLICATION NO. : 10/164431
DATED : February 8, 2005
INVENTOR(S) : Terry L. Gilton It is certified that error appears in the above-identified patent and that said Letters Patent is hereby corrected as shown below:

CLAIM 73, COLUMN 12, LINE 2, after "location than" change "the" to --a--

Signed and Sealed this

Third Day of October, 2006

JON W. DUDAS
*Director of the United States Patent and Trademark Office*